United States Patent [19]

Shimizu

[11] Patent Number: 5,293,334
[45] Date of Patent: Mar. 8, 1994

[54] PATTERN LAYOUT OF POWER SOURCE LINES IN SEMICONDUCTOR MEMORY DEVICE

[75] Inventor: Mitsuru Shimizu, Sakura, Japan

[73] Assignee: Kabushiki Kaisha Toshiba, Kawasaki, Japan

[21] Appl. No.: 799,078

[22] Filed: Nov. 27, 1991

[30] Foreign Application Priority Data

Nov. 30, 1990 [JP] Japan .................................. 2-329856

[51] Int. Cl.⁵ .................................................. H01L 27/10
[52] U.S. Cl. .................................... 365/51; 365/226
[58] Field of Search .............. 365/51, 226, 227, 228; 307/296.1, 296.2, 296.7; 257/206, 207, 208

[56] References Cited

U.S. PATENT DOCUMENTS

| | | | |
|---|---|---|---|
| 4,439,841 | 3/1984 | Itoh et al. | 365/51 |
| 4,525,809 | 6/1985 | Chiba et al. | 365/51 |
| 4,695,978 | 9/1987 | Itakura | 365/51 |
| 4,825,276 | 4/1989 | Kobayashi | 257/207 |
| 5,007,025 | 4/1991 | Hwang et al. | 365/226 |

FOREIGN PATENT DOCUMENTS

| | | | |
|---|---|---|---|
| 0041844 | 12/1981 | European Pat. Off. . | |
| 0081368 | 12/1985 | European Pat. Off. . | |
| 0190027 | 8/1986 | European Pat. Off. . | |
| 0135747 | 8/1984 | Japan | 257/207 |
| 63-94499 | 4/1988 | Japan . | |
| 0015948 | 1/1989 | Japan | 365/226 |
| 0035934 | 2/1989 | Japan | 257/207 |
| 0052435 | 2/1990 | Japan | 257/207 |
| 0268439 | 11/1990 | Japan | 257/207 |
| 1087183 | 5/1982 | United Kingdom . | |

OTHER PUBLICATIONS

Massengill et al., "Voltage Span Modeling For Very Large Memory Arrays", NASECODE IV: Proceedings of the 4th International Conference On Numerical Analysis of Semiconductor Devices and Integrated Circuits, Jun. 19, 1985, pp. 396-404.

Cook et al., "1 um MOSFET VLSI Technology: Part III—Logic Circuit Design Methodology and Applications", IEEE Transactions on Electron Devices, vol. 26, No. 4, Apr. 1979, pp. 333-334.

Wada et al., "Master-Slice Layout Design for Emitter-Coupled Logic LSI", Review of the Electrical Communication Laboratories, vol. 26, No. 9, 10 Sep. 1978, pp. 1355-1366.

"Electronic Parts and Materials". Noticeable Articles in ISSCC '83, May 1983, pp. 123-129.

*Primary Examiner*—Eugene R. LaRoche
*Assistant Examiner*—Vu A. Le
*Attorney, Agent, or Firm*—Banner, Birch, McKie & Beckett

[57] ABSTRACT

A first power source line is formed around a memory area having a memory cell array, column decoder, row decoder and sense amplifier formed therein. The first power source line is applied with a potential which is obtained by lowering a power source voltage supplied from the exterior. A second power source line is formed in the surrounding region of the first power source line. The second power source line is applied with a ground potential. A first peripheral circuit driven by a voltage between the lowered potential and the ground potential is disposed in an area between the first and second power source lines. The first peripheral circuit is a circuit used for the memory area. A third power source line is formed in the surrounding region of the second power source line. The third power source line is applied with a power source potential supplied from the exterior. A second peripheral circuit driven by a voltage between the power source potential and the ground potential is disposed in an area between the second and third power source lines. The second peripheral circuit is a circuit used for an external circuit of a chip.

26 Claims, 3 Drawing Sheets

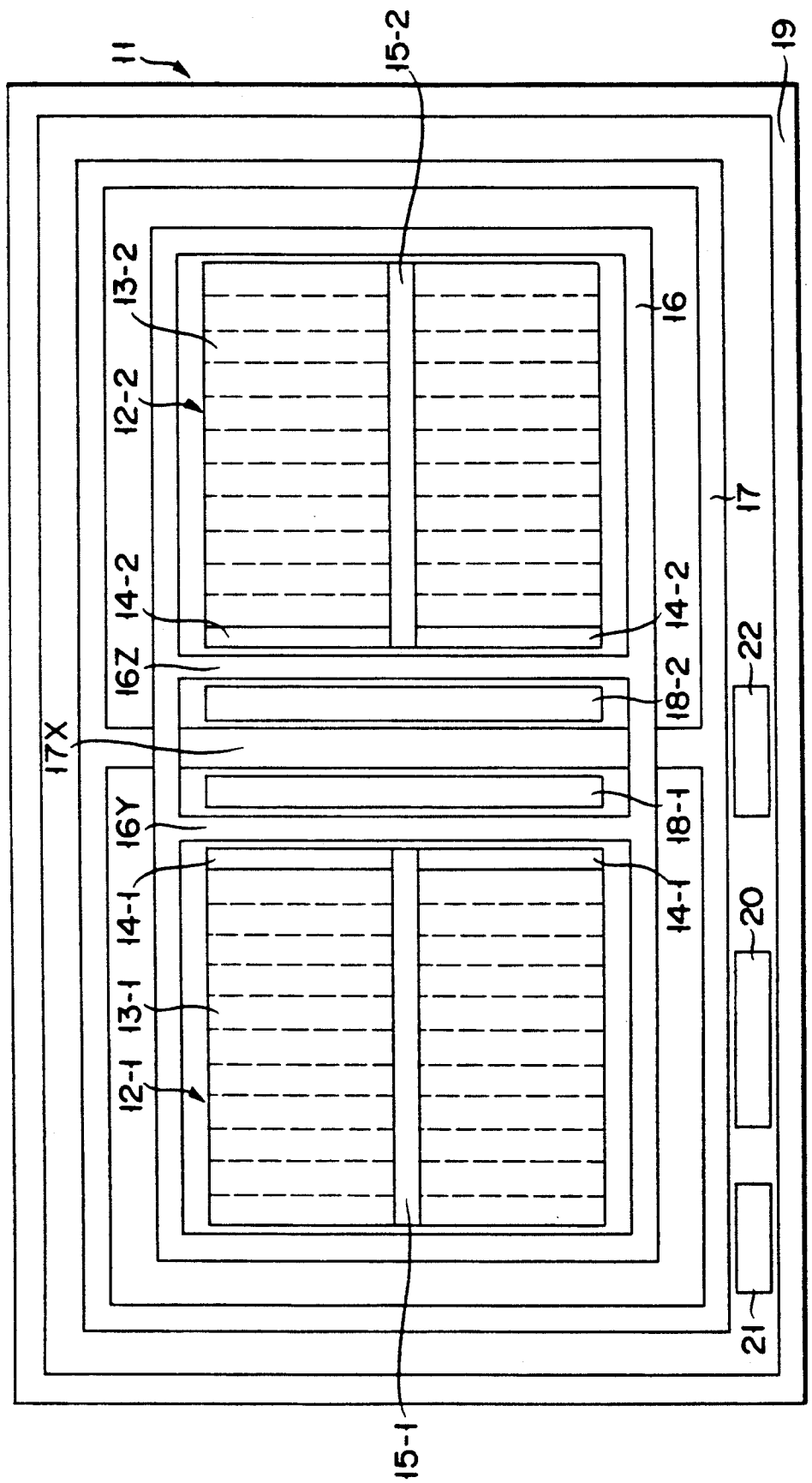
F I G. 3

PATTERN LAYOUT OF POWER SOURCE LINES IN SEMICONDUCTOR MEMORY DEVICE

BACKGROUND OF THE INVENTION

1. Field of the Invention

This invention relates to the chip layout of a semiconductor memory device, and more particularly to the pattern layout of power source lines in a semiconductor memory device.

2. Description of the Related Art

Various configurations of the chip layout in a semiconductor memory device such as a dynamic RAM or static RAM are disclosed in "ELECTRONIC PARTS AND MATERIALS" May 1983, pp 123–129 "Noticeable Articles in ISSCC'83" issued from the Industry Researching Society, for example.

In recent years, the integration density of the semiconductor memory device has been markedly increased, and with the formation of the semiconductor memory device of even higher integration density, the size of memory cells has been reduced. Since the thickness of the insulation film of the miniaturized memory cell is reduced, the breakdown voltage thereof becomes lower and the reliability thereof becomes lower. In order to ensure the high reliability of the memory cell, attempts have been made to lower the power source potential of a memory area and a circuit used for the memory area. That is, the power source potential supplied to the chip from the exterior is set to 5V, for example, which is the same level as that used at present and the power source potential for the memory area and the circuit used for the memory area is set to a potential level (for example, 3.0V to 3.5V) which is lower than 5V. Therefore, even if a thin insulation film is used in the miniaturized memory cell, the dielectric breakdown can be suppressed and the reliability can be kept high.

However, in a device formed based on the above method, three power source lines, that is, a power source line for applying 5V to the chip, a power source line applied with a voltage less than 5V and a power source line applied with a ground potential are required. As a result, the number of power source lines in the above device is increased in comparison with a case of the conventional device in which only a 5V power source is used. Further, since not only a peripheral circuit used for the memory area but also a peripheral circuit used for the external portion of the chip are provided in the chip, a useless area may be provided on the chip and the chip area may be increased unless special and careful attention is given to the arrangement of the peripheral circuits and the laying of the power source lines.

SUMMARY OF THE INVENTION

Accordingly, an object of this invention is to provide a semiconductor memory device having an improved chip layout.

Another object of this invention is to provide a semiconductor memory device having power source lines of a pattern layout which can suppress an increase in the chip area to a minimum.

Still another object of this invention is to provide a semiconductor memory device in which three types of power source lines, a peripheral circuit used for a memory area and a peripheral circuit used for the external portion of the chip are efficiently arranged on a single chip.

The above objects of this invention can be attained by a semiconductor memory device comprising a semiconductor body; a memory area provided in the semiconductor body; a first power source line arranged around the memory area and applied with a first potential; a second power source line arranged in the surrounding region of the first power source line and applied with a second potential; a first circuit disposed in that area of the semiconductor body which lies between the first and second power source lines and driven by a potential difference between the first and second potentials; a third power source line arranged in the surrounding region of the second power source line and applied with a third potential; and a second circuit disposed in that area of the semiconductor body which lies between the second and third power source lines and driven by a potential difference between the second and third potentials.

With the above construction, areas in which the first circuit driven by a potential difference between the first and second power source lines and the second circuit driven by a potential difference between the second and third power source lines are formed are separately provided and the second power source line can be commonly used by the first and second circuits. As a result, the pattern layout of the three types of power source lines, and the first and second circuits can be optimized, and the wiring length of the three types of power source lines and the degree of useless wiring extension can be reduced in comparison with a case wherein formation areas for the first and second circuits are provided in a mixed state. Therefore, a semiconductor memory device can be provided in which the three types of power source lines and the first and second circuits can be efficiently arranged on a single chip and an increase in the chip area caused by use of the three power source lines can be suppressed to a minimum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a pattern plan view showing the chip layout of power source lines and peripheral circuits of a semiconductor memory device according to a third embodiment of this invention.

DETAILED DESCRIPTION OF THE PREFERRED EMBODIMENTS

Figure 1:
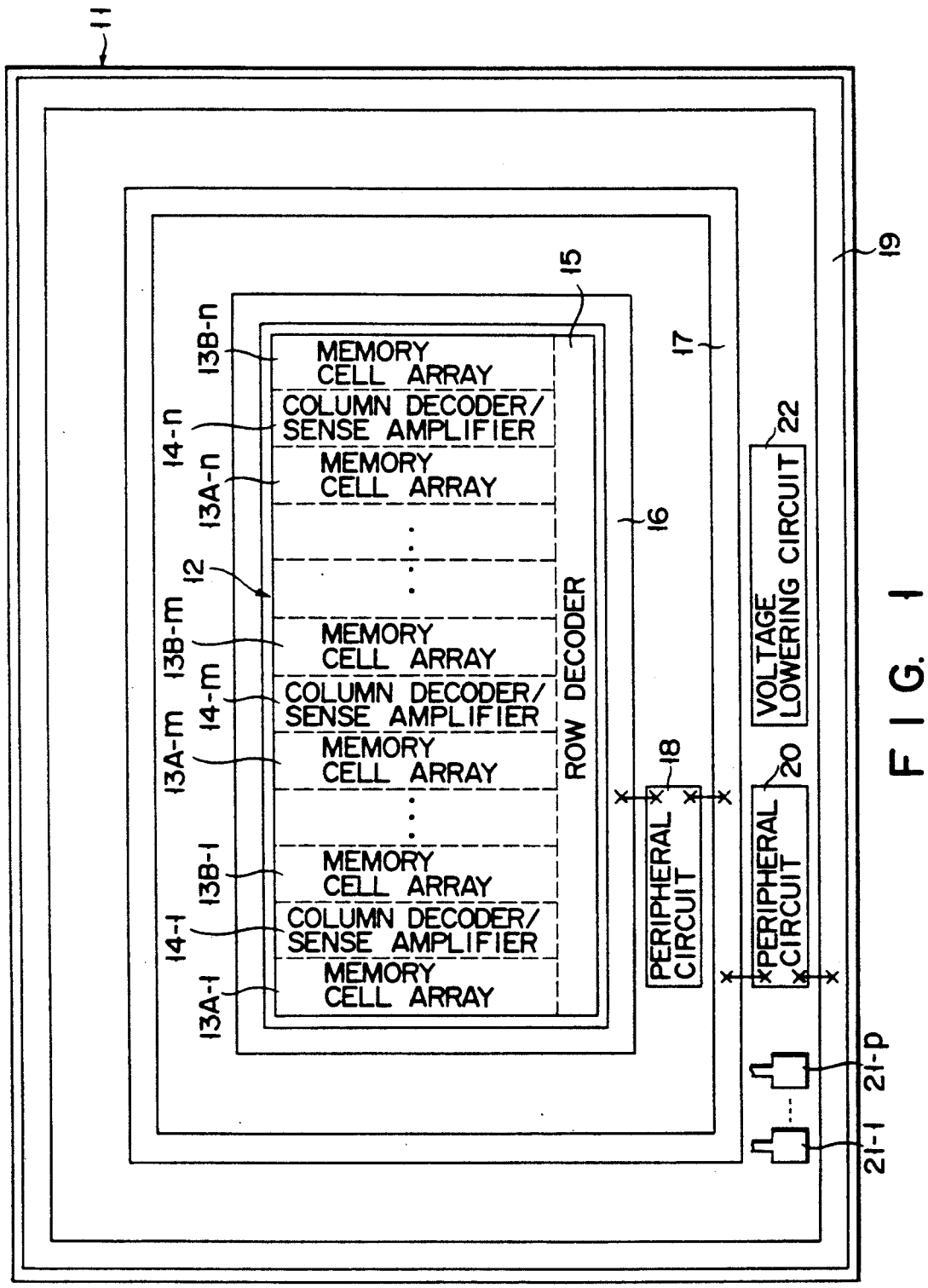
FIG. 1 is a pattern plan view showing the pattern layout of power source lines and peripheral circuits of a semiconductor memory device according to a first embodiment of this invention.

As shown in FIG. 1, a memory area 12 is disposed in the central portion of a chip 11 (semiconductor body). Memory cell arrays 13A-1, 13B-1, ..., 13A-m, 13B-m, ..., 13A-n, 13B-n, column decoders/sense amplifiers 14-1, ... 14-m, ..., 14-n, and a row decoder 15 are arranged in the memory area 12. Memory cells are arranged in a matrix form in the respective memory cell arrays 13A-1, 13B-1, ..., 13A-m, 13B-m, ..., 13A-n, 13B-n. The column decoder selects the columns of the memory cell arrays 13A-1, 13B-1, ..., 13A-m, 13B-m, ..., 13A-n, 13B-n. The row decoder 15 selects the rows of the memory cell arrays 13A-1, 13B-1, ..., 13A-m, 13B-m, ..., 13A-n, 13B-n. The sense amplifier amplifies and outputs data read out from a memory cell selected by the column decoder and the row decoder 15.

A first power source line 16 applied with a potential Vint of 3.0 to 3.5V, for example is laid around the memory area 12. The power source line 16 applies the potential Vint to the sense amplifier, column decoder, row decoder and the like in the memory area 12 as a power source potential. A second power source line 17 applied with a ground potential Vss is disposed in the surrounding region of the power source line 16. A first peripheral circuit 18 driven by a potential difference between the power source lines 16 and 17 is provided in that area of the chip 11 which lies between the power source lines 16 and 17. The first peripheral circuit 18 is a circuit used for the memory area 12, for example, an address buffer circuit. A third power source line 19 applied with a power source potential Vext of 5V, for example, from the exterior of the chip 11 is disposed in the surrounding region of the power source line 17. A second peripheral circuit 20 driven by a potential difference between the power source lines 19 and 17, data output or input pads 21-1 to 21-p and a voltage lowering circuit 22 are provided in that area of the chip 11 which lies between the power source lines 19 and 17. The peripheral circuit 20 is a circuit used for the external portion of the chip 11, for example, an input/output buffer and an input protection circuit. The pads 21-1 to 21-p are provided only for the partial area in FIG. 1, but in practice, they are formed at a regular interval in the area between the power source lines 19 and 17 to surround the memory area 12. The voltage lowering circuit 22 creates the potential Vint by lowering the potential difference (5V) between the potential Vext applied to the power source line 19 and the potential Vss applied to the power source line 17 to a certain potential level (3.0 to 3.5V) and applies the thus created potential to the power source line 16. When the potential Vint is applied from the exterior, the voltage lowering circuit 22 is not necessary.

In the pattern layout described above, areas in which the peripheral circuit 18 driven by a voltage between the power source lines 16 and 17 and used for the memory area 12 and the peripheral circuit 20 driven by a voltage between the power source lines 19 and 17 and used for the external portion of the chip 11 are formed are separated with the power source line 17 used as a boundary and the power source line 17 is commonly used by the peripheral circuits 18 and 20. As a result, the pattern layout of the three power source lines 16, 17 and 19 and the peripheral circuits 18 and 20 can be optimized, and the wiring length of the three types of power source lines 16, 17 and 19 can be reduced and the degree of useless wiring extension can be reduced in comparison with a case wherein areas in which the peripheral circuits 18 and 20 are formed are provided in a mixed state. Therefore, a semiconductor memory device is provided in which the power source lines 16, 17 and 19 and the first and second peripheral circuits 18 and 20 can be efficiently arranged on the chip 11 and an increase in the chip area caused by use of the three power source lines 16, 17 and 19 can be suppressed to a minimum.

Further, since the areas in which the first peripheral circuit 18 and the second peripheral circuit 20 are formed are clearly separated with the power source line 17 used as a boundary, the peripheral circuit 18 can be efficiently arranged and the high degree of integration can be attained irrespective of the presence of the second peripheral circuit 20 even if the area for the first peripheral circuit 18 is increased with an increase in the memory capacity (4 M-bit, 16 M-bit, 64 M-bit, 256 M-bit, ...).

Further, since the power source line 19 is disposed near the outer end portion of the chip 11, and the second peripheral circuit 20, pads 21-1 to 21-p and voltage lowering circuit 22 are arranged in the area between the power source lines 19 and 17, the degree of freedom of the pattern design can be enhanced.

Figure 2:
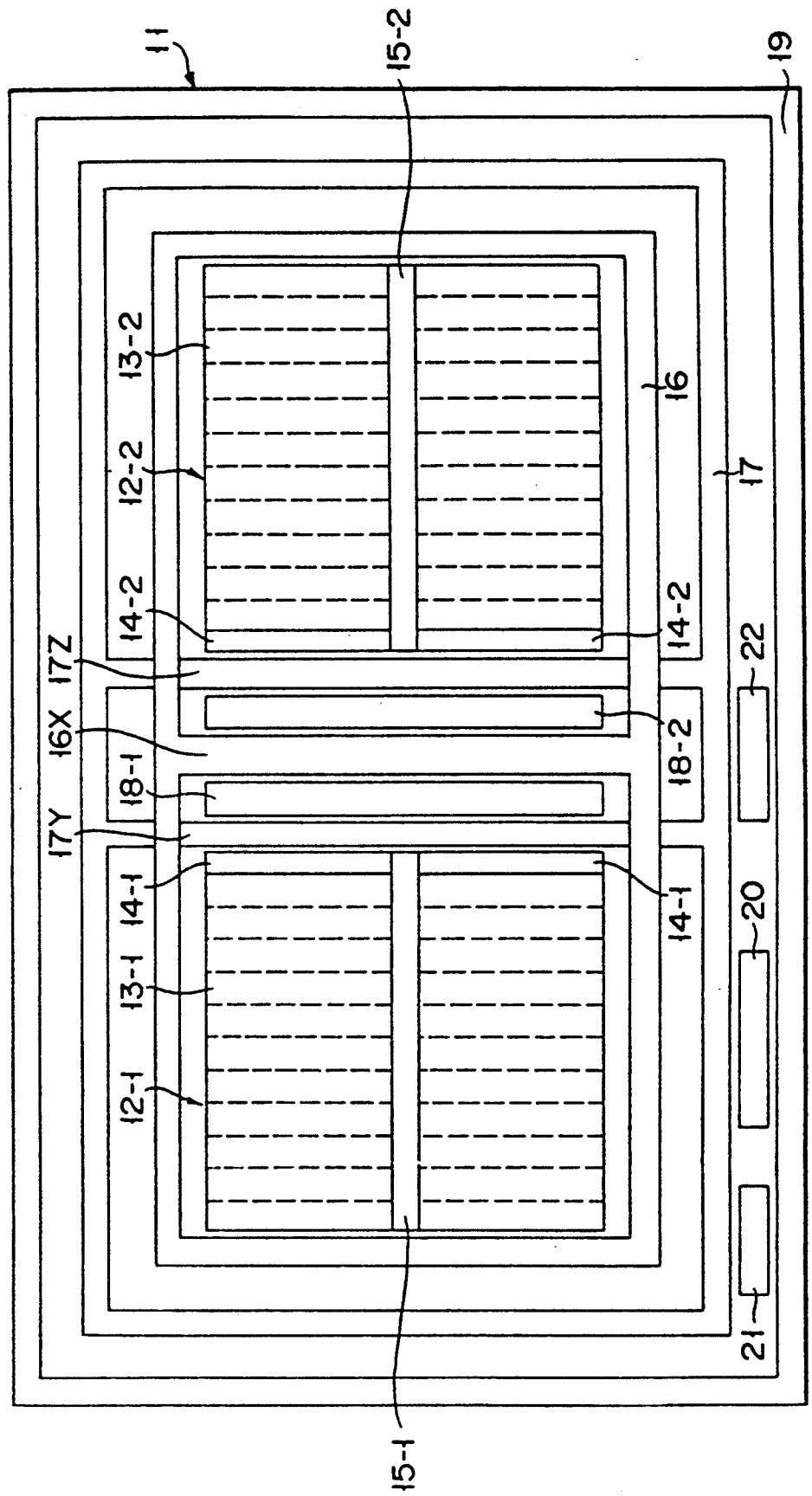
FIG. 2 is a pattern plan view showing the chip layout of power source lines and peripheral circuits of a semiconductor memory device according to a second embodiment of this invention.

FIG. 2 is a pattern plan view schematically showing the chip layout of a semiconductor memory device according to a second embodiment of this invention. In the first embodiment, a single memory area is formed in the central portion of the chip 11, but in the second embodiment, this invention is applied to a case wherein a plurality of memory areas (two in this embodiment) are provided, that is, the memory area in the pattern shown in FIG. 1 is divided into a plurality of portions (two portions).

First and second memory areas 12-1 and 12-2 are separately disposed in the central portion of the chip 11. Like the case of FIG. 1, memory cell arrays 13-1 and 13-2, column decoders/sense amplifiers 14-1 and 14-2, and row decoders 15-1 and 15-2 are formed in the respective memory areas 12-1 and 12-2. A first power source line 16 applied with a potential Vint is formed around the memory areas 12-1 and 12-2. A portion 16X of the power source line 16 is formed to pass through substantially the central portion of an area between the memory areas 12-1 and 12-2. A second power source line 17 is formed to surround the first power source line 16. The power source line 17 is applied with a ground potential Vss. Portions 17Y and 17Z of the power source line 17 are formed on both sides of the portion 16X on an area between the memory areas 12-1 and 12-2. A peripheral circuit 18-1 driven by a voltage between the power source line portions 16X and 17Y is formed in an area defined by the portions 16X and 17Y of the power source lines and lying between the memory areas 12-1 and 12-2 and a peripheral circuit 18-2 driven by a voltage between the power source line portions 16X and 17Z is formed in an area defined by the portions 16X and 17Z of the power source lines. A third power source line 19 is formed in the surrounding region of the second power source line 17 along the outer periphery of the chip 11. The power source line 19 is applied with a potential Vext given from the exterior of the chip 11. A second peripheral circuit 20, pad 21 and voltage lowering circuit 22 are formed in an area between the power source lines 17 and 19. The voltage lowering circuit 22 lowers the potential Vext (5V) supplied to the power source line 19 from the exterior to a lower level (3.0 to 3.5V) and applies the lowered potential to the peripheral circuits 18-1 and 18-2 and the memory areas 12-1 and 12-2 via the first power source line 16.

The patterns of the first and second power source lines 16 and 17 may be formed to overlap on each other as shown in FIG. 2 by using a first-level layer containing aluminum as the second power source line 17, using a second-level layer containing aluminum as the first power source line 16, and forming an insulation film between the first- and second level layers. Further, the first-level layer, second-level layer or a layer containing aluminum and formed above the first- and second-level layers may be used as the third power source line 19.

With the above pattern layout described above, the power source line 16 can be commonly used by the peripheral circuit 18-1 used for the memory area 12-1 and the peripheral circuit 18-2 used for the memory area 12-2 in the area between the two memory areas 12-1 and 12-2. As a result, when three types of power source lines are used and the memory area is divided into a plurality of memory sections, the three types of power source lines 16, 17 and 19, the peripheral circuits 18-1, 18-2 and 20 driven by potential differences between the power source lines 16, 17 and 19 and the voltage lowering circuit 22 can be efficiently arranged on the chip 11.

It is also possible to provide a peripheral circuit driven by a potential difference between the potentials Vint and Vss in an area between the power source lines 16 and 17 except an area between the memory areas 12-1 and 12-2 when necessary. In this case, it is preferable that the memory areas 12-1 and 12-2 and the peripheral circuit which is less frequently accessed are arranged in the above area and the peripheral circuit which is frequently accessed is arranged in the area between the memory areas 12-1 and 12-2.

FIG. 3 is a pattern plan view schematically showing the chip layout of a semiconductor memory device according to a third embodiment of this invention. In the second embodiment, the portion 16X of the first power source line 16 is formed in the area between the memory areas 12-1 and 12-2 and the portions 17Y and 17Z of the second power source line 17 are disposed on both sides of the power source line 16, but in the third embodiment, a portion 17X of a second power source line 17 is formed in the central area of an area between the memory areas 12-1 and 12-2 and portions 16Y and 16Z of a first power source line 16 are formed on both sides of the second power source line. In FIG. 3, portions which are the same as those of FIG. 2 are denoted by the same reference numerals and the detail explanation therefor is omitted.

With the pattern structure shown in FIG. 3, substantially the same effect as that of FIG. 2 can be obtained.

As described above, according to this invention, a semiconductor memory device can be provided in which three power source lines applied with three different potentials, a first peripheral circuit driven by a power source potential supplied from the exterior and a peripheral circuit driven by a lowered power source potential can be efficiently arranged on a chip even when the power source voltage for the memory area and the peripheral circuit used for the memory area is lowered in order to suppress reduction in the breakdown voltage of the miniaturized memory cell and ensure the high reliability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
    a semiconductor body;
    a memory area provided in said semiconductor body;
    a first power source line arranged around said memory area and applied with a first potential;
    a second power source line arranged in the surrounding region of said first power source line and applied with a second potential;
    a first circuit disposed in that area of said semiconductor body which lies between said first and second power source lines and driven by a potential difference between said first and second potentials;
    a third power source line arranged in the surrounding region of said second power source line and applied with a third potential;
    a second circuit disposed in that area of said semiconductor body which lies between said second and third power source lines and driven by a potential difference between said second and third potentials; and
    lowering means for lowering the potential difference between said second and third potentials to produce the first potential.

2. A device according to claim 1, wherein said lowering means is provided in that area of said semiconductor body which lies between said second and third power source lines.

3. A device according to claim 1, wherein said memory area includes a memory cell array, a row decoder for selecting a row of said memory cell array, a column decoder for selecting a column of said memory cell array, and a sense amplifier for amplifying data read out from a memory cell selected by said row decoder and said column decoder.

4. A device according to claim 1, wherein said first circuit includes a circuit for transferring data with respect to said memory area.

5. A device according to claim 4, wherein said circuit for transferring data with respect to said memory area includes an address buffer.

6. A device according to claim 1, wherein said second circuit includes a circuit for transferring data with respect to the exterior.

7. A device according to claim 6, wherein said circuit for transferring data with respect to the exterior includes an input/output buffer.

8. A semiconductor memory device comprising:
    a semiconductor body;
    a memory area provided in said semiconductor body;
    a first power source line arranged around said memory area and applied with a first potential;
    a second power source line arranged in the surrounding region of said first power source line and applied with a second potential;
    a first circuit disposed in that area of said semiconductor body which lies between said first and second power source lines and driven by a potential difference between said first and second potentials;

a third power source line arranged in the surrounding region of said second power source line and applied with a third potential; and a second circuit disposed in that area of said semiconductor body which lies between said second and third power source lines and driven by a potential difference between said second and third potentials, wherein the third potential is supplied from the exterior, the second potential is a ground potential supplied form the exterior, and the first potential is a lowered potential difference between the third potential and the ground potential.

9. A semiconductor memory device comprising:

a semiconductor body;

a first memory area provided in said semiconductor body;

a second memory area provided in said semiconductor body and spaced from said first memory area;

a first power source line comprising a first portion surrounding both said first and second memory areas and a second portion located in the space between said first and second memory areas, said first power source line applied with a first potential;

a second power source line comprising a first portion surrounding said first portion of said first power source line and a second portion located in the space between said first and second memory areas, said second power source line applied with a second potential;

a first circuit disposed in that area of said semiconductor body which lies between said second portion of said first power source line and said second portion of said second power source line, said first circuit driven by a potential difference between said first and second potentials;

a third power source line arranged in the surrounding region of said second power source line and applied with a third potential;

a second circuit disposed in that area of said semiconductor body which lies between said first portion of said second power source line and said third power source line and driven by a potential difference between said second and third potentials; and lowering means for lowering the potential difference between said second and third potentials to produce the first potential.

10. A device according to claim 9, wherein said voltage lowering means is provided in that area of said semiconductor body which lies between said second and third power source lines.

11. A device according to claim 9, wherein each of said first and second memory areas includes memory cell arrays, a row decoder for selecting rows of said memory cell arrays, a column decoder for selecting columns of said memory cell arrays, and a sense amplifier for amplifying data read out from memory cells selected by said row decoder and said column decoder.

12. A semiconductor memory device comprising:

a semiconductor body;

a first memory area provided in said semiconductor body;

a second memory area provided in said semiconductor body and spaced form said first memory area;

a first power source line comprising a first portion surrounding both said first and second memory areas and a second portion located in the space between said first and second memory areas, and first power source line applied with a first potential;

a second power source line comprising a first portion surrounding said first portion of said first power source line and a second portion located in the space between said first and second memory areas, said second power source line applied with a second potential and being formed of a layer at a level different from that of a layer forming said first power source line;

a first circuit disposed in that area of said semiconductor body which lies between said second portion of said first power source line and said second portion of said second power source line, said first circuit driven by a potential difference between said first and second potentials;

a third power source line arranged in the surrounding region of said second power source line and applied with a third potential; and a second circuit disposed in that area of said semiconductor body which lies between said first portion of said second power source line and said third power source line and driven by a potential difference between said second and third potentials, wherein said second power source line is formed of a first-level layer containing aluminum and said first power source line if formed of a second-level layer containing aluminum.

13. A semiconductor memory device comprising:

a semiconductor body;

a first memory area provided in said semiconductor body;

a second memory area provided in said semiconductor body in a position separated from said first memory area;

a first power source line comprising a portion surrounding said first and second memory areas and at least another portion located between said first and second memory areas and applied with a first potential;

a second power source line comprising a portion surrounding said first power source line and at least another portion located between said first and second memory areas, and applied with a second potential, said second power source line being formed of a layer at a level different from that of a layer forming said first power source;

a first circuit disposed in that area of said semiconductor body which lies between said at least another portion of said first power source line and said at least another portion of said second power source line, and driven by a potential difference between said first and second potentials;

a third power source line arranged in the surrounding region of said second power source line and applied with a third potential; and a second circuit disposed in that area of said semiconductor body which lies between said second and third power source lines and driven by a potential difference between said second and third potentials, wherein the third potential is supplied from the exterior, the second potential is a ground potential supplied form the exterior, and the first potential is a lowered potential difference between the third potential and the ground potential.

14. A device according to claim 9, wherein said first circuit includes a circuit for transferring data with respect to said memory area.

15. A device according to claim 14, wherein said circuit for transferring data with respect to said memory area includes an address buffer.

16. A device according to claim 9, wherein said second circuit includes a circuit for transferring data with respect to the exterior.

17. A device according to claim 16, wherein said circuit for transferring data with respect to the exterior includes an input/output buffer.

18. The semiconductor memory device of claim 1, wherein said first power source line surrounds said memory area, said second power source lien surrounds said first power source line, and said third power source line surrounds said second power source line.

19. The semiconductor memory device according to claim 9, wherein said second power source line is formed of a layer at a level different from that of a layer forming said first power source line.

20. The semiconductor memory device of claim 9, wherein said second power source line further comprises a third portion located in the space between said first and second memory areas.

21. The semiconductor memory device of claim 20, further comprising a third circuit disposed in that area of said semiconductor body which lies between said third portion of said second power source line and said second portion of said first power source line, said third circuit driven by said potential difference between said first and second potentials.

22. The semiconductor memory device of claim 20, wherein said first power source line if formed of a layer at a level different from that of a layer forming said second power source line.

23. The semiconductor memory device of claim 22, wherein said layer of which said first power source line is formed is above said layer of which said second power source line is formed.

24. The semiconductor memory device of claim 9, wherein said first power source line further comprises a third portion located in the space between said first and second memory areas.

25. The semiconductor memory device of claim 24, further comprising a third circuit disposed in that area of said semiconductor body which lies between said third portion of said first power source line and said second portion of said second power source line, said third circuit driven by said potential difference between said first and second potentials.

26. The semiconductor memory device of claim 9, wherein said third power source line surrounds said second power source line.

* * * * *

UNITED STATES PATENT AND TRADEMARK OFFICE
CERTIFICATE OF CORRECTION

PATENT NO. : 5,293,334
DATED : March 8, 1994
INVENTOR(S) : Mitsuru Shimizu

It is certified that error appears in the above-indentified patent and that said Letters Patent is hereby corrected as shown below:

In the claims:

Col. 7, claim 12, line 64, "form" and insert --from--

Col. 7, claim 12, line 68, delete "and" (2nd occurrence) and insert --said--.

Col. 8, claim 13, line 48, delete "source;" and insert --source line;--

Col. 8, claim 13, line 64, delete "form" and insert --from--

Col. 9, claim 18, line 12, delete "lien" and insert --line--.

Signed and Sealed this

Twenty-sixth Day of July, 1994

Attest:

BRUCE LEHMAN

Attesting Officer      Commissioner of Patents and Trademarks